(12) United States Patent
Rouaissia et al.

(10) Patent No.: US 12,278,628 B2
(45) Date of Patent: Apr. 15, 2025

(54) PROXIMITY SENSOR FOR PORTABLE WIRELESS DEVICE

(71) Applicant: Semtech Corporation, Camarillo, CA (US)

(72) Inventors: Chaouki Rouaissia, Neuchâtel (CH); Remi Le Reverend, San Diego, CA (US)

(73) Assignee: SEMTECH CORPORATION, Camarillo, CA (US)

( * ) Notice: Subject to any disclaimer, the term of this patent is extended or adjusted under 35 U.S.C. 154(b) by 223 days.

(21) Appl. No.: 18/078,169

(22) Filed: Dec. 9, 2022

(65) Prior Publication Data

US 2023/0216497 A1 Jul. 6, 2023

Related U.S. Application Data

(60) Provisional application No. 63/297,089, filed on Jan. 6, 2022.

(51) Int. Cl.
*H03K 17/955* (2006.01)
*G01D 5/24* (2006.01)
*H04W 4/40* (2018.01)

(52) U.S. Cl.
CPC ............ *H03K 17/955* (2013.01); *H04W 4/40* (2018.02); *G01D 5/24* (2013.01)

(58) Field of Classification Search
CPC ...... H03K 17/00; H03K 17/94; H03K 17/945; H03K 17/955; H03K 2217/00;

(Continued)

(56) References Cited

U.S. PATENT DOCUMENTS 11,337,091 B2 * 5/2022 Meingast ................ H04L 67/54
2014/0015595 A1 * 1/2014 Van Ausdall ........ H04B 1/3838
327/517

(Continued)

FOREIGN PATENT DOCUMENTS

EP 2336990 A1 * 6/2011 ......... G08B 13/1445
EP 3402074 A1 11/2018

(Continued)

OTHER PUBLICATIONS

European Search Report for EP 22205961 mailed Jun. 1, 2023, 9 pages.

(Continued)

*Primary Examiner* — Hoai-An D. Nguyen
(74) *Attorney, Agent, or Firm* — BLANK ROME LLP

(57) ABSTRACT

A proximity sensor for a portable wireless connected device, the sensor being arranged to determine whether a part of a user's body is near the portable connected wireless device. The sensor generates a time-averaged proximity that is alerted when the device is brought near a part of a user's body for a given time and may be periodically reset momentarily during the periods of proximity. An integration time comparable with that used in SAR testing, enables the sensor to reduce the radio power emitted by a portable device when it is near the body. The integration time can be obtained by a sigma/delta modulator configured as rate-compression unit.

14 Claims, 9 Drawing Sheets

(58) Field of Classification Search
CPC ..... H03K 2217/94; H03K 2217/94042; H03K 2217/96; H03K 2217/9607; H03K 2217/960705; H03K 2217/96071; H04M 1/00; H04M 1/72; H04M 1/724; H04M 1/72403; H04M 1/72409; H04M 1/72448; H04M 1/72454; G01D 5/00; G01D 5/12; G01D 5/14; G01D 5/24
USPC .................................. 324/600, 649, 658, 663
See application file for complete search history.

(56) References Cited

U.S. PATENT DOCUMENTS

| | | |
|---|---|---|
| 2015/0237183 A1 | 8/2015 | Novet |
| 2016/0018447 A1 | 1/2016 | Nys et al. |
| 2018/0059870 A1 | 3/2018 | Krah |
| 2018/0329575 A1 | 11/2018 | Rouaissia |
| 2018/0331706 A1 | 11/2018 | Nys et al. |

FOREIGN PATENT DOCUMENTS

| | | | |
|---|---|---|---|
| EP | 2872905 B1 | 3/2019 | |
| EP | 3869691 A2 | 8/2021 | |
| JP | 2007242046 A * | 9/2007 | ............. G08G 1/127 |

OTHER PUBLICATIONS

Federal Communications Commission, FCC 19-126; Dec. 4, 2019; 159 pgs.

* cited by examiner

PROXIMITY SENSOR FOR PORTABLE WIRELESS DEVICE

REFERENCE DATA

The present application claims the benefit of prior date of U.S. provisional patent application 63/297,089 of Jan. 6, 2022, the contents whereof are hereby incorporated in their entirety.

TECHNICAL DOMAIN

The present invention concerns a smart proximity sensor and a circuit for processing the output of a proximity sensor. The invention is concerned especially, but not exclusively, with a connected portable device, such as a mobile phone or a tablet that is equipped with such a proximity sensor and processor and is arranged to adapt the RF emitted from a radio interface to maintain a Specific Absorption Rate (SAR), Power Density (PD), or any RF exposure within given limits.

RELATED ART

Capacitive proximity detectors are used in many modern portable devices, including mobile phones and tablets, to determine whether the device is close to a body part of a user. This information is important in several ways: it is used to detect whether the telephone is being actively manipulated by a user, and whether the user is looking at the display, in which case the information displayed can be adapted, and/or the device switch from a low power state to an active one. Importantly, this information is used to adapt the power level of the radio transmitter to comply with statutory SAR limits. Capacitive proximity detection is used also in touch-sensitive displays and panels.

Known capacitive sensing systems measure the capacitance of an electrode and, when the device is placed in proximity of the human body (for example the hand, the head, or the lap) detect an increase in capacitance. The variations in the sensor's capacitance are relatively modest, and often amount to some percent of the "background" capacitance seen by the sensor when no conductive body is in the proximity. Known capacitive detection systems may include a digital processor for subtracting drift and noise contributions and deliver a digital value of the net user's capacitance in real time and/or a digital binary flag indicating the proximity status based on a programmable threshold.

Proximity sensors are used in portable wireless devices to reduce the power of a radio transmitter when the device is close to the user's body, for example when a mobile phone is moved to the ear for making a call or put in a pocket. By reducing the power only when the device is close, regulatory exposure limits can be respected, without compromising the connectivity excessively, since the device can transmit at maximum power when it is not close to the body. EP 3402074 A1 and US 2015/237183 A1 disclose such uses.

Exposure limits to radio energy are set by several national and international standards. They generally include both spatial (mass, surface) and time averaging conditions. The ICNIRP standard (74, Health Physics 494 (1998)) provides for averaging over 6 minutes at 10 GHz and reduces to 10 seconds at 300 GHz on a complex basis. The IEEE standard (IEEE Std C95.1-2019 (2019)) has an averaging time of 25 minutes at 6 GHz dropping to 10 seconds at 300 GHz. The FCC (https://docs.fcc.gov/public/attachments/FCC-19-126A1.pdf) proposes an averaging time of 100 seconds below 2.9 GHz dropping to 1 second above 95 GHz.

It is known to limit the power of a radio transmitter in a portable device to keep the average SAR/PD value in a sliding time window below the regulatory safety limit. In this approach, the actual transmission power is reduced according to the monitored traffic, irrespective of whether the device is close to the user or not. These devices do not rely on a proximity sensor to respect the regulatory SAR/PD limits.

Proximity sensors are usually configured to generate a prompt proximity signal, that is a signal that is immediately asserted as soon as the sensor is moved near to a target object. EP 3869691 A1 discloses a sensor configured to output a time-averaged proximity signal.

SHORT DISCLOSURE OF THE INVENTION

An aim of the present invention is the provision of a device/method that overcomes the shortcomings and limitations of the state of the art. These aims are attained by the object of the attached claims.

The present invention proposes a proximity sensor that, when it is used in a portable wireless device, enables ways of reducing the SAR dose to a user of a portable device without compromising the connectivity too much.

In contrast with the known (immediate) approach in which the RF power is reduced as soon as the portable device is near the user, the proximity sensor is configured to generate a time/averaged proximity signal that is not immediately asserted when the portable device is moved near the user, but only after a certain time, if the proximity perdures. Importantly, the time-averaged proximity signal may be reset to zero briefly even while the portable device is near the user, and then reasserted again. In this way, the radio power is caused to rise momentarily. While this short increases in power do not add much to the integrated SAR dose, they can improve considerably the data connection. Connectivity is less degraded and may not be reduced at all if the proximity is only transitory.

In a variant (immediate/time averaged), the proximity signal ensues as soon as the device is brought near the user, but the reduction of power is not permanent. Rather, RF power is cycled between a high value and a low value such that SAR is reduced, but connectivity is less affected.

The two approaches can be combined, and a time averaged proximity signal may be used to determine a cyclic reduction of RF power, rather than a permanent one.

SHORT DESCRIPTION OF THE DRAWINGS

Embodiments of the invention are disclosed in the description and illustrated by the drawings in which.

Figure 4:
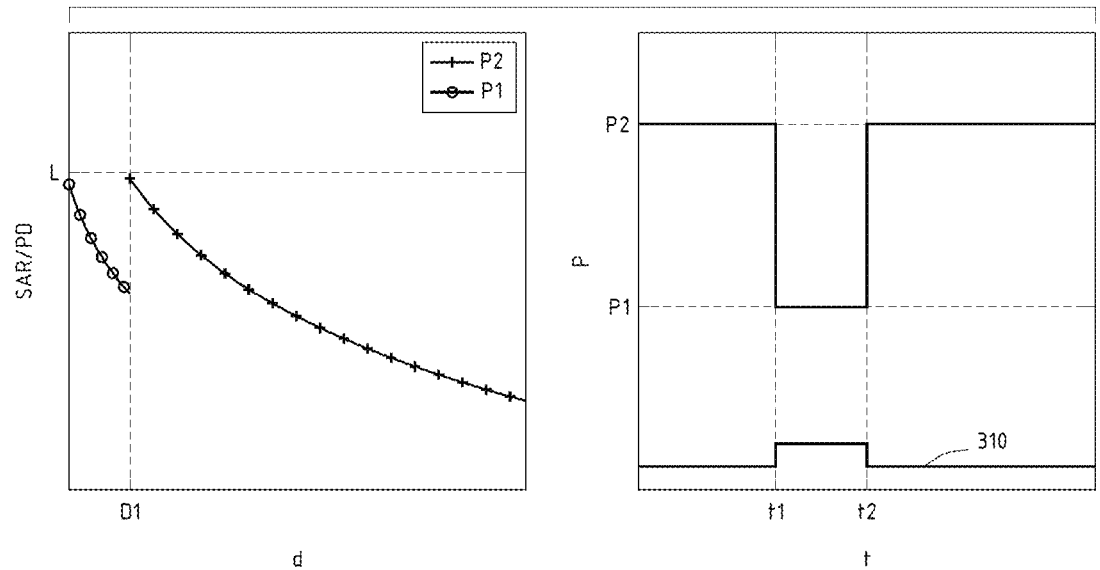
Figure 5:
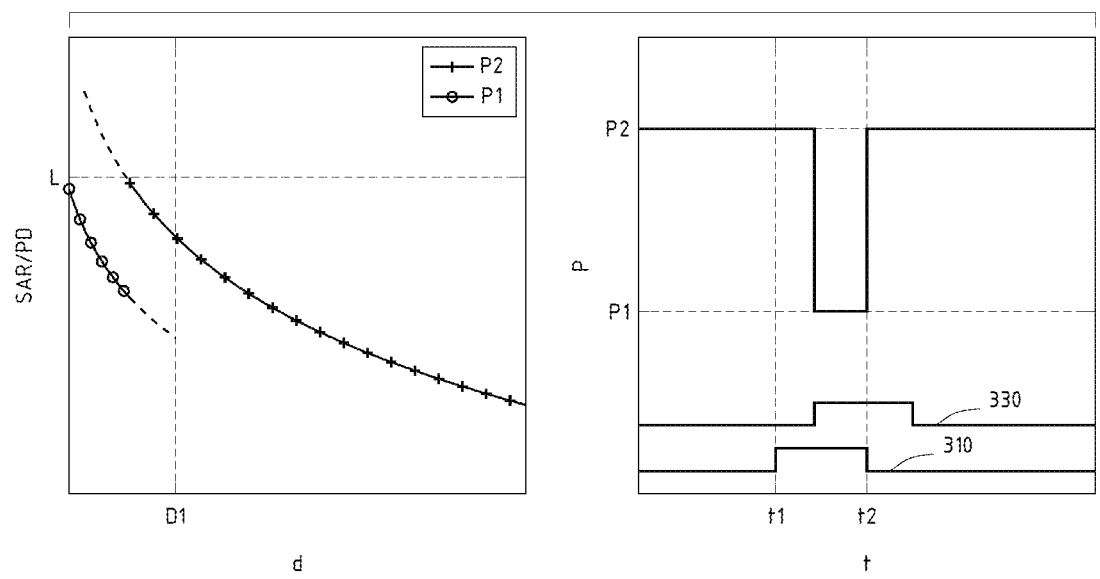

FIGS. 4 and 5 plot the dose over distance and the power over time from a mobile device using an immediate proximity flag and a time-averaged flag.

Figure 6:
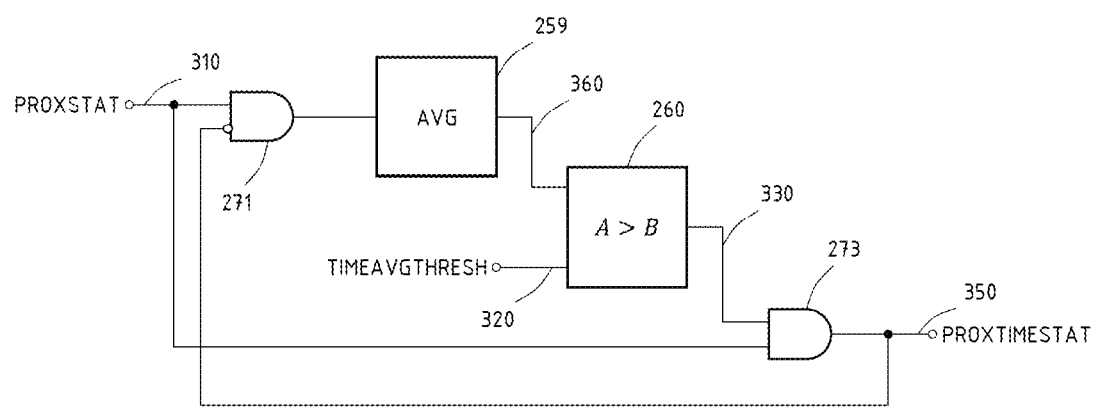
Figure 9:
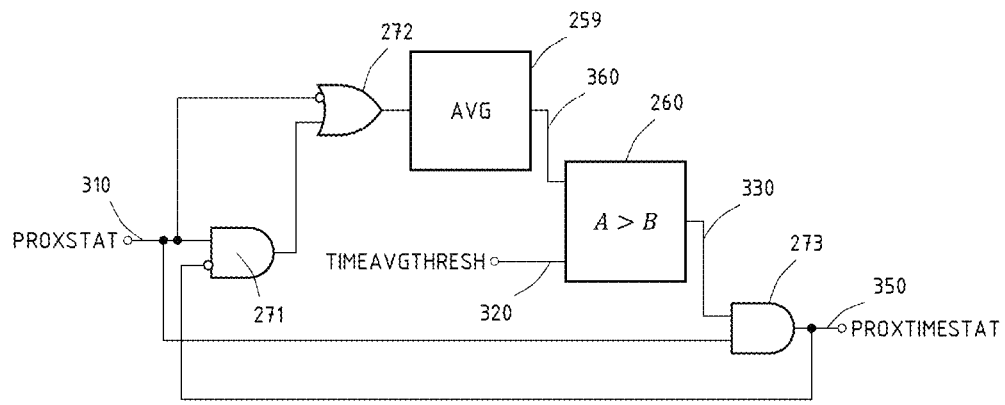

FIGS. 6 and 9 are schematic representations of a variants of the inventive processor.

Figure 7:
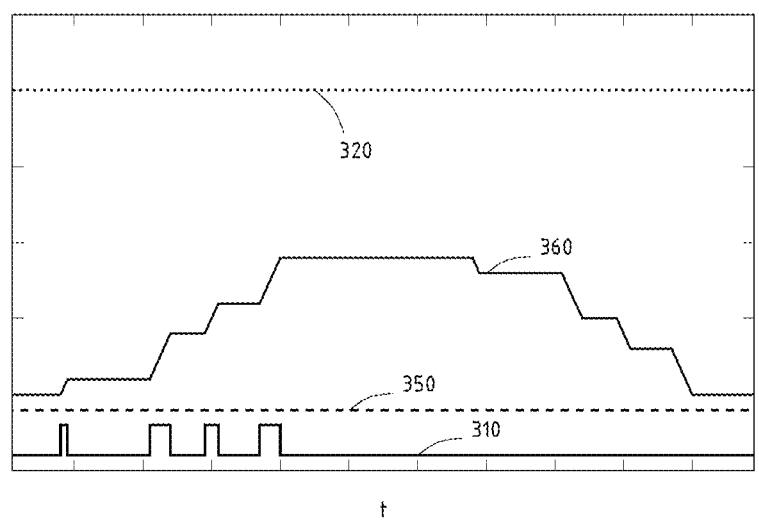
Figure 8:
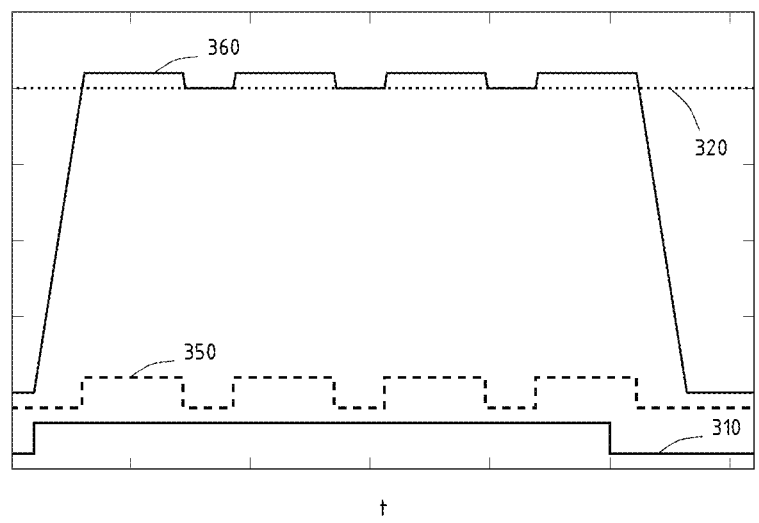

FIGS. 7 and 8 plot the proximity signals generated by the inventive circuit.

Figure 10:
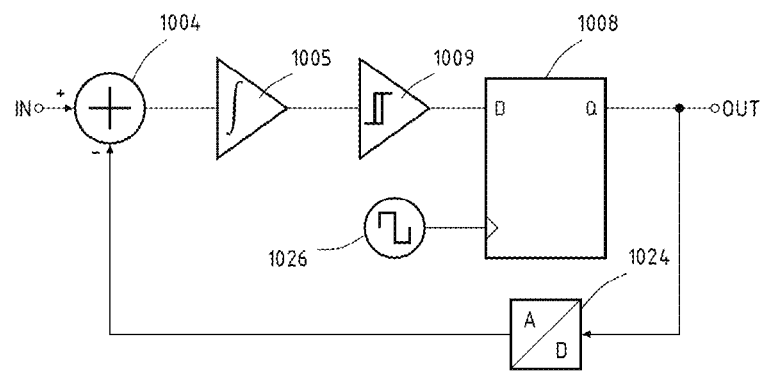

FIG. 10 is a schematic representation of a sigma-delta converter

Figure 11:
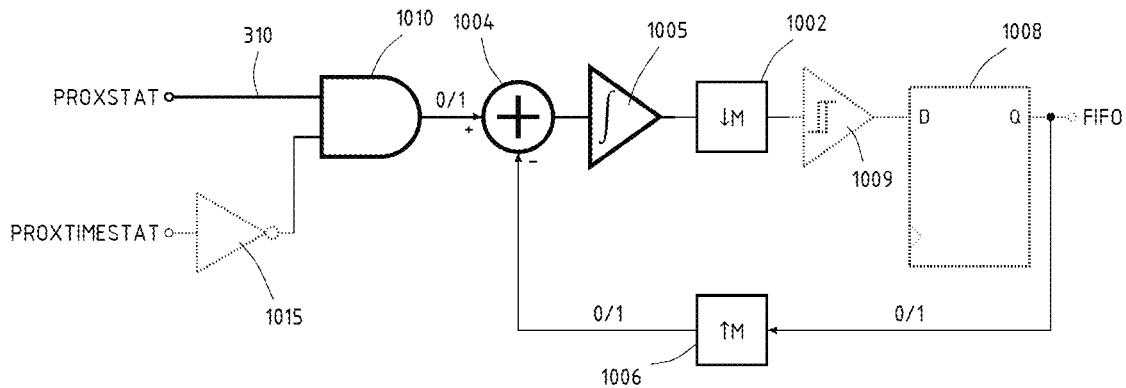
Figure 12:
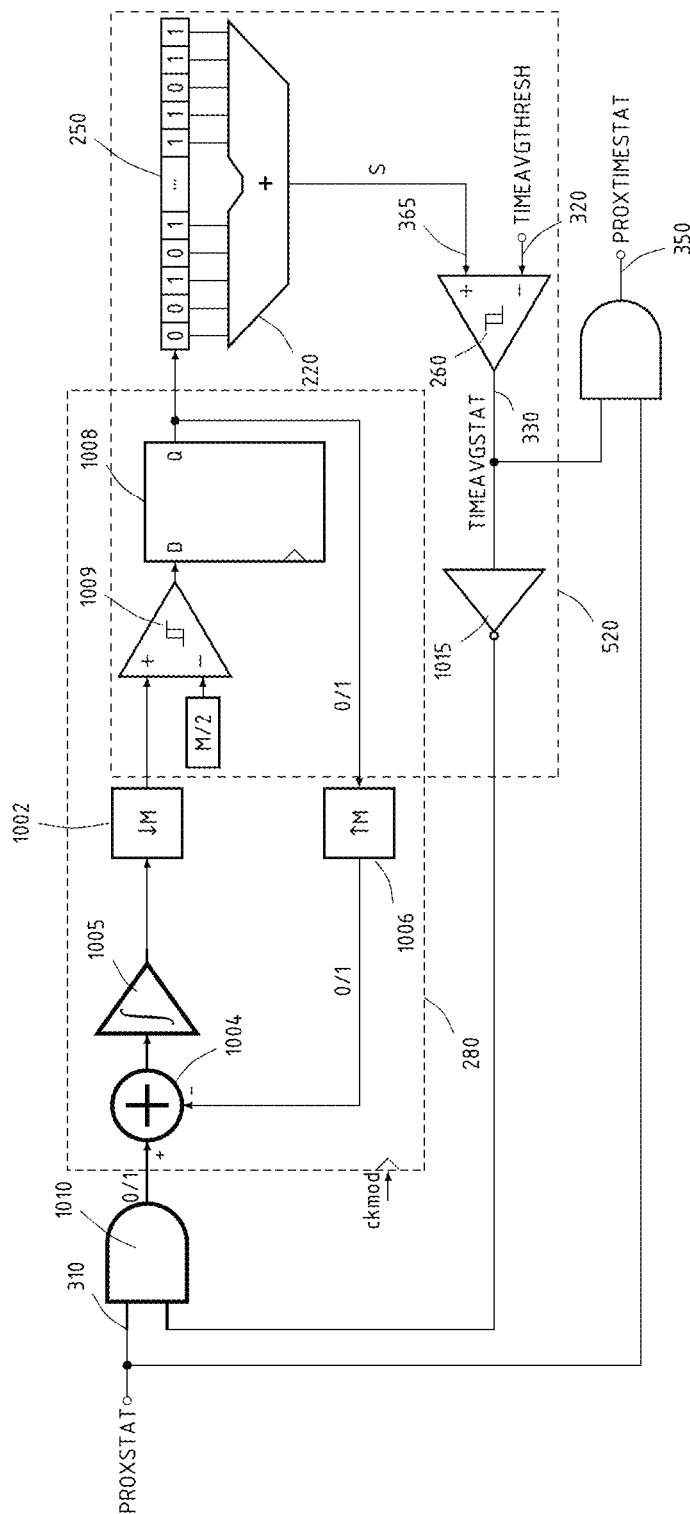
Figure 13:
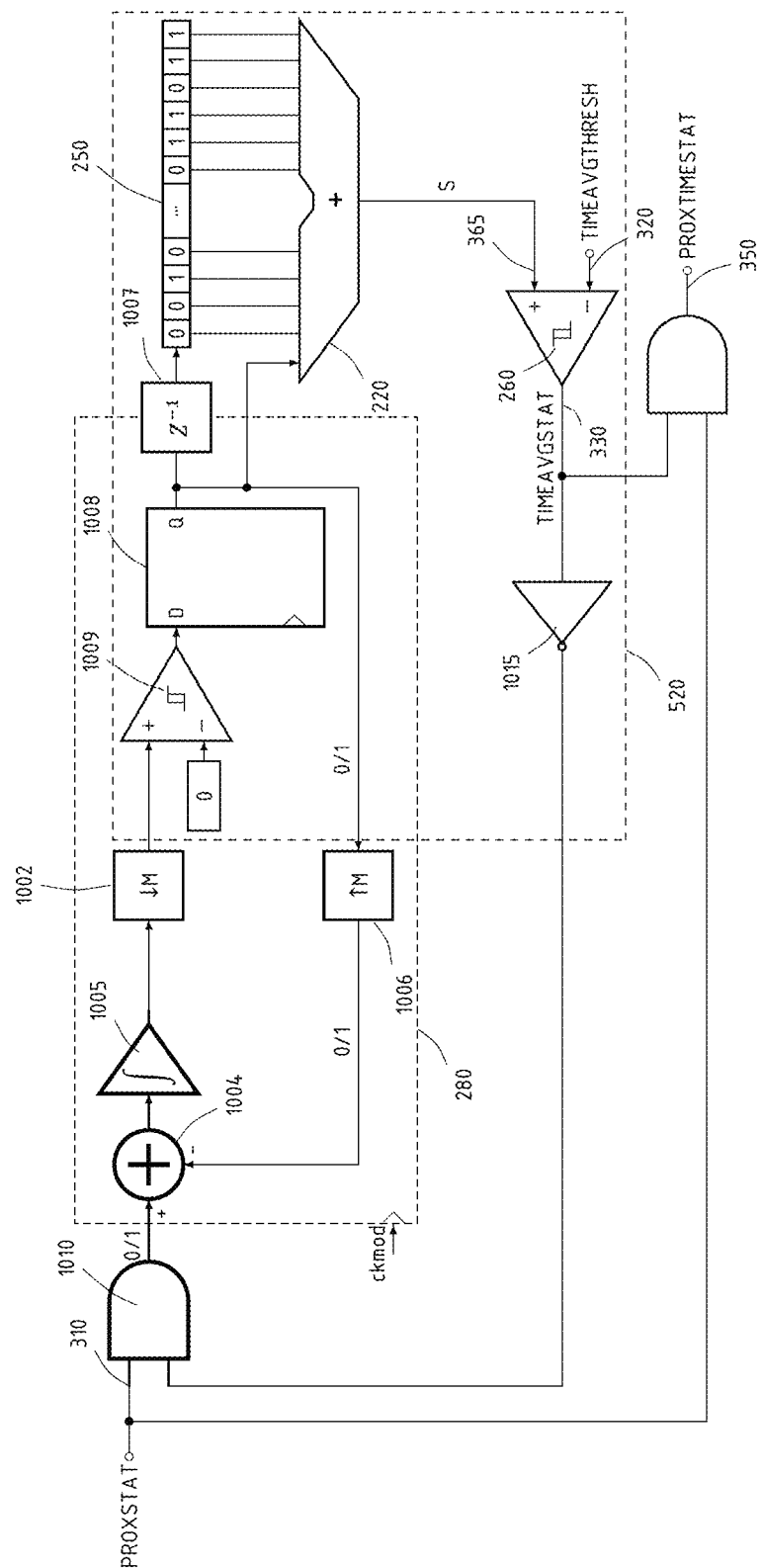
Figure 14:
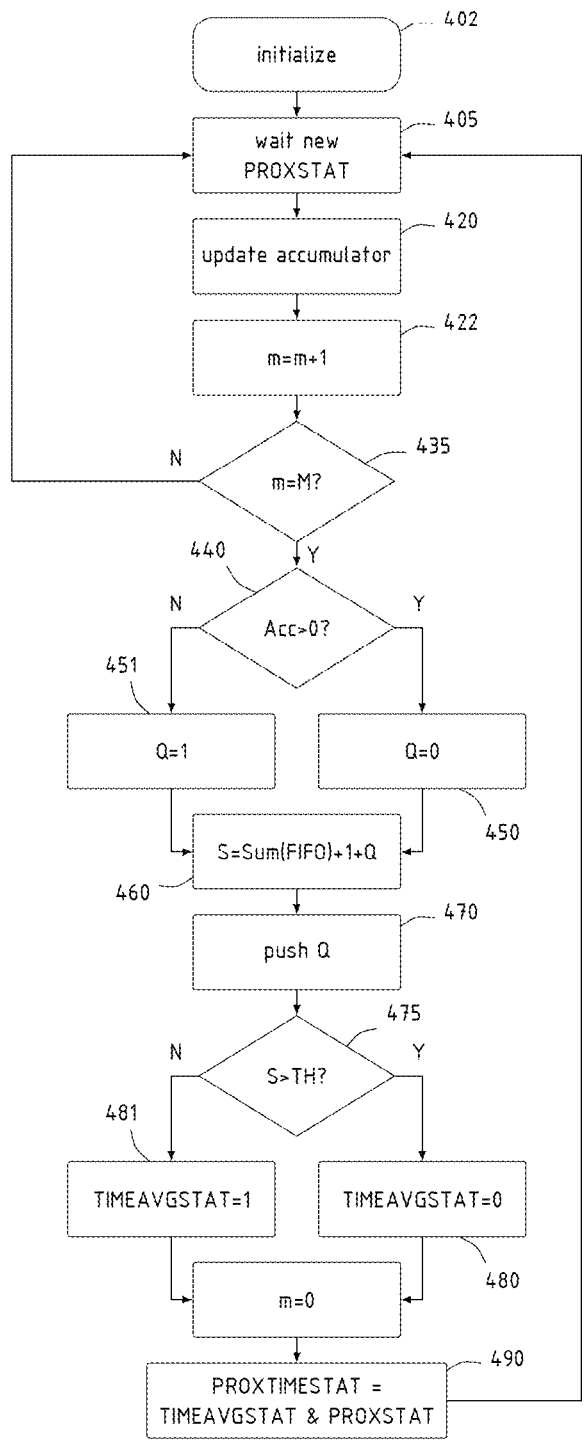
Figure 15:
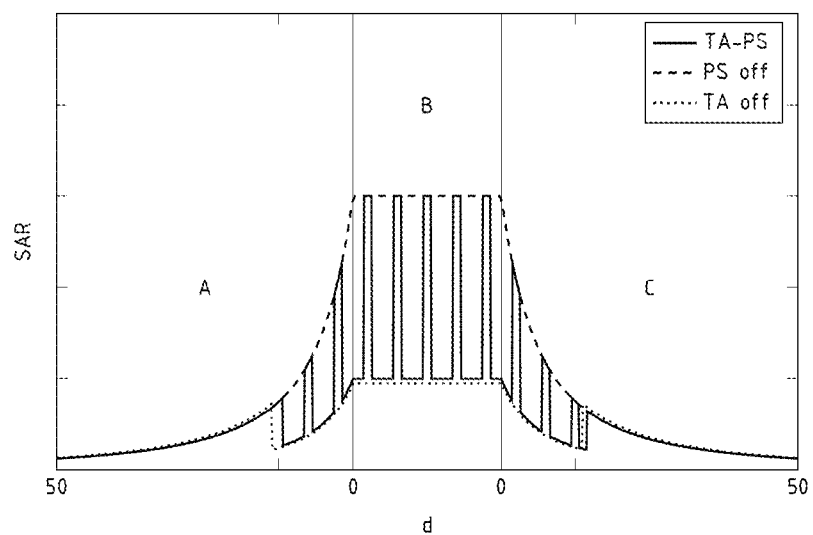

FIG. 11 is a schematic representation of a sigma-delta converter as used in variants of the invention FIG. 12 is a schematic diagram of an embodiment FIG. 13 is an improved embodiment FIG. 14 shows an inventive method as a flowchart FIG. 15 shows the action of the proximity sensor when a part of the body approaches a mobile device, remains in contact for a while, then retracts away

EXAMPLES OF EMBODIMENTS OF THE PRESENT INVENTION

Figure 1:
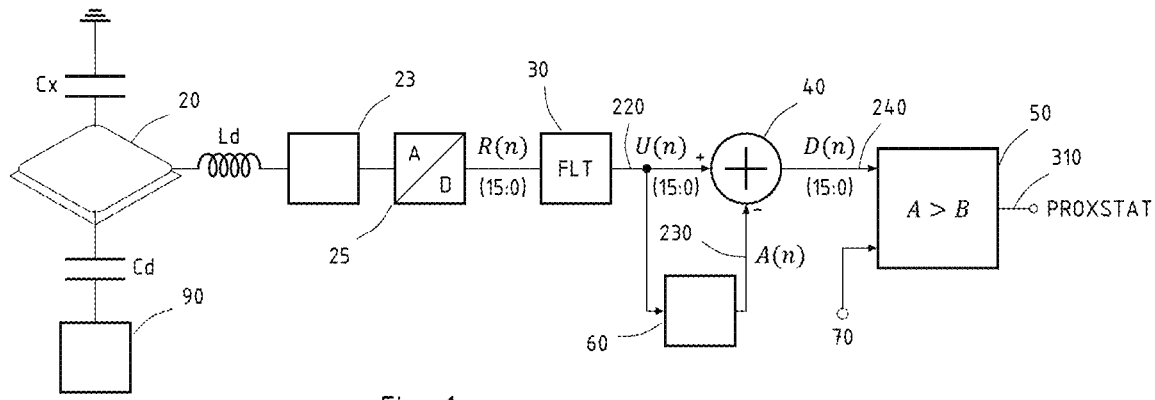
FIG. 1 illustrates schematically a capacitive proximity sensor in a portable connected wireless device.

FIG. 1 shows schematically a capacitive proximity detector in a connected portable device such as a portable phone, laptop computer, or tablet, but the filter and the method of the invention could be applied to diverse fields.

The detector is sensitive to the capacitance Cx of an electrode 20 that will increase slightly at the approach of a user's hand, face or body. The variations due to body proximity are overshadowed by the own capacitance of the electrode 20 which, in turn, is not stable. The capacitance signal is preferably amplified and processed by an analogue processor 23, which may also subtract a programmable offset, and converted into raw digital values by an A/D converter 25. The samples R(n) may be encoded as 16 bits integers or in any other suitable format.

The raw samples R(n) contain also, in a non-ideal world, noise and unwanted disturbances that are attenuated by a filter 30, providing a series of samples U(n) useful for the processing in the successive stages.

Preferably, the detector includes the drift-correction circuit represented here by elements 60 and 40. 160 is a baseline estimator that generates a series of samples A(n) that approximate the instantaneous value of the baseline, considering drift. This is then subtracted from the U(n) samples in difference unit 40 and provides the drift-corrected samples D(n). A discriminator unit 50 then generates a binary value 'PROXSTAT' that indicates the proximity of the user's hand, face, or body. In the following, the 'PROXSTAT' variable is treated as a binary value. The invention is not so limited, however, and encompasses detectors that generate multi-bit proximity values as well. The reference input 70 of the discriminator is a suitable threshold value, which may be predetermined at manufacturing, defined in an individual or type calibration, set dynamically by an host processor, or defined in any other way.

Should the capacitive proximity sensor be part of a connected portable device for SAR control, the sensor electrode 20 will preferably be placed close to the transmitting antenna of the RF transmitter, to determine accurately the distance from the radio source. The sensor electrode 20 could be realized by a conductor on a printed circuit board or on a flexible circuit board and may have guard electrodes on the back and at the sides, to suppress detection of bodies and objects at the back or on the sides of the device.

In the same application, the capacitive electrode 20 could serve also as RF antenna, or part thereof. FIG. 1 shows this feature of the invention. The electrode 20 is connected, through a decoupling capacitor $C_d$, to a radio transmitter and receiver unit 90, and has an inductor $L_d$, or another RF-blocking element, to block the radiofrequency signal. Otherwise, the radio unit 90 could be connected to an antenna separate and independent from the sense electrode 20 which, in this case, could be connected directly to the analogue interface 23 without the decoupling inductor $L_d$.

Figure 2:
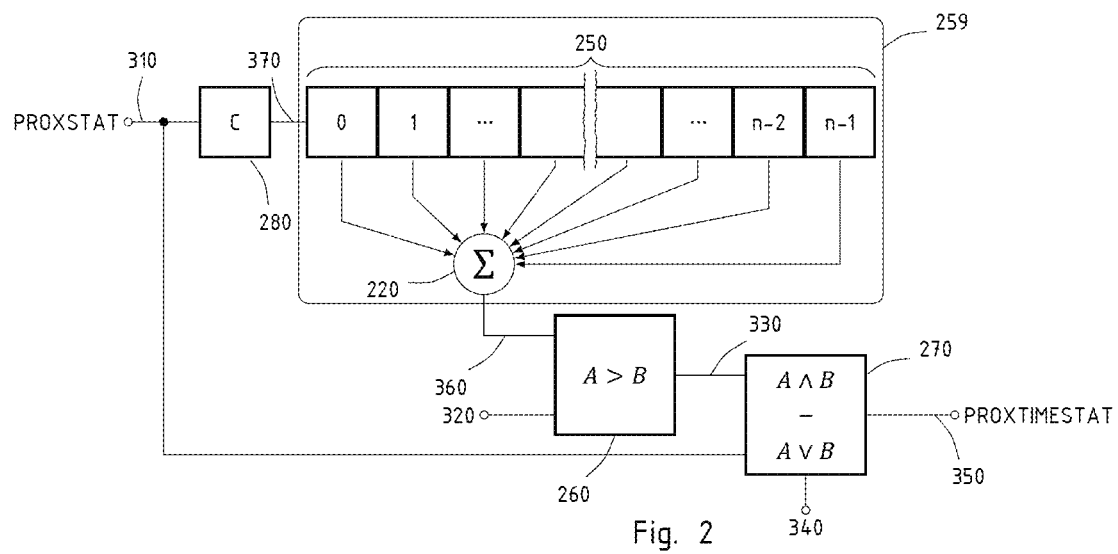
FIG. 2 illustrates the behaviour of a part of the processor of the invention.

FIG. 2 show schematically a processor that processes the PROXSTAT signal 310 to determine a time-averaged TIME-AVGSTAT status flag that is high when the user has been close to the device for some time. When the user approaches the telephone to the body, TIMEAVGSTAT does not become high immediately, therefore fleeting approaches do not cause a reduction in transmission power. When the telephone remains in closeness to the user's body for some time, the TIMEAVGSTAT status flag is raised.

To function, the circuit of FIG. 2 has some form of memory that retains a trace of past states of the immediate proximity flag PROXSTAT. While several variants are possible, this example has an accumulator 280 and a FIFO buffer 250. The PROXSTAT variable is available at terminal 310. the accumulator 280 adds together the values of PROXSTAT each time a new value is available and is periodically reset to zero. The time between successive resets is predetermined and defines a granularity interval.

At the end of the granularity interval, before the resetting of the accumulator 280, a new value is pushed in the FIFO buffer 250 by the serial input 370. If the value of accumulator 280 is zero, or below a determined threshold, then a value '0' is pushed in the FIFO. Otherwise, a value '1' is pushed in the FIFO.

Preferably, the length of the FIFO buffer 250 is variable and can be set at will, within predefined limits. In an exemplary implementation the buffer 250 can have a length of up to 256 places. The length of the FIFO buffer 250 and the granularity interval between each reset of the accumulator 28 define the length of a sliding time window that is used to average the immediate proximity status flag, relative to the rate of generation of new PROXSTAT values.

Note that the purpose of accumulator 280 is to slow down the insertion of new values in the FIFO buffer and, consequently, to limit the length of the FIFO buffer 250 needed to obtain a given time window. The window size is determined in relation to the integration level allowed in the regulation and, if the desired window size were quite short and memory not a limiting factor, the accumulator 280 could be dispensed with.

Note also that the present disclosure deals with the special case in which the immediate status flag PROXSTAT is a one-bit value, and the content of the accumulator 280 is quantized to one bit before being pushed in the FIFO buffer. The FIFO buffer has therefore a width of one bit. This is not a necessary limitation, however, and the invention also includes variants in which the immediate flag PROXSTAT is a multi-bit variable, the accumulator 280 accumulates a suitable function of PROXSTAT that indicates whether the device is near, and the values pushed in the FIFO buffer 250 are also multi-bit variables.

Note also that the FIFO buffer 250 can be implemented in various ways without leaving the scope of the invention, for example with a shift register or a ring buffer.

The values comprised in the FIFO buffer 250 are samples of the immediate status flag PROXSTAT in a sliding time window, whose length is defined by the length of the buffer times the granularity interval between successive introductions of new values in the buffer. The adding unit 220 sums all the values in the FIFO buffer—which, the values being single bits, is the same as counting them—and the result is compared with a predetermined threshold 320 in the comparator 260 to produce a time-averaged proximity status flag 330. Preferably, the comparator 260 has a hysteresis to avoid multiple transitions when the input value 360 lingers close to the threshold value 320.

While the figure shows an adder 220 reading all the values in the FIFO buffer through the respective parallel outputs at each cycle, this is not the only manner of implementing a sliding sum. A possible variant, for example, may include a register to which the new values entering the buffer at one side are added, and the old values dropping out of the other side of the buffer are subtracted at each cycle. The block 259 comprising the FIFO buffer 25a and the adder 220 can be regarded functionally as an averaging, or as a sliding sum unit. Although the represented variant is preferred, being stable and easy to implement, all possible implementations of averaging units or sliding sum units may be adopted instead.

The time-averaged proximity status TIMEAVGSTAT could be used to modify the power of a radio transmitter of a portable device, in lieu of the immediate proximity status PROXSTAT. In a preferred variant, a logic unit 270 is used to generate a combined status PROXTIMESTAT, available at terminal 350, that is the result of a logic operation on PROXSTAT and TIMEAVGSTAT. The logic operation may be a logic 'or', or a logic 'and', and is preferably selectable by a suitable variable PROXTIMECONFIG, corresponding to wire 340 in FIG. 2.

Figure 3:
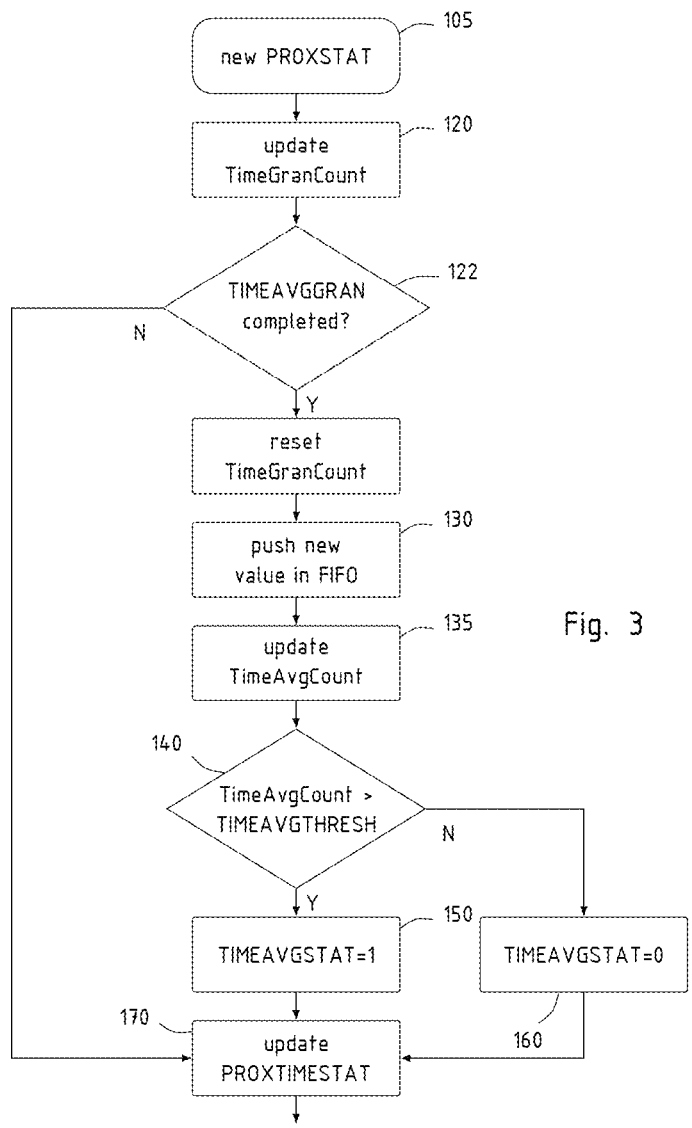
FIG. 3 shows schematically the same behaviour, as a flowchart.

FIG. 3 illustrates the behaviour of the invention in a flowchart. The method starts with the generation of a new value of PROXSTAT (step 105) that the circuit of FIG. 1 produces at periodic regular intervals. In step 120, the accumulator 280, here indicated by the variable 'TimeGranCount' is updated. In step 122 the system checks whether the current granularity interval is complete. In most cases, the granularity interval will not be complete, and the system will take the 'N' branch, update the value of the combined status PROXTIMESTAT (step 170) and end the processing, until the next PROSTAT value is available.

At the end of a granularity interval, the invention pushes a new value in the FIFO buffer (step 130) which new value may be a '0' or a '1' as disclosed above, or another suitable value, if the FIFO buffer allows multi-bit values, the sliding sum TIMEAVGCOUNT is recalculated, compared with the threshold value TIMEAVGTHRESH (step 140) and the time-averaged flag TIMEAVGSTAT is set accordingly (steps 150 and 160).

Plots 4 and 5 illustrate how the power of a radio transmitter can be controlled to respect SAR/PD limitations, in the invention. Plots 4 show the situation in which the radio power is governed by the immediate flag PROXSTAT only. The left-side plot shows the dose level as function of the distance for two power levels: P2 is the full power, and P1 is a reduced "safe" power that is selected by the immediate proximity status PROXSTAT, trimmed to fire when the distance reaches the value D1 at which the dose at nominal power reaches the maximum admissible level 'L'. The right-side plot shows that the power level is 'P2' when PROXSTAT (trace 310) is inactive and is immediately lowered to 'P1' when PROXSTAT is active.

Plot 5 shows a case in which the output power is governed by the combined status PROXTIMESTAT, computed in this case by a logic 'and' of PROXSTAT (trace 310) and TIMEAVGSTAT (trace 330).

FIG. 6 shows a variant of the invention comprising a logic AND gate 271 at the input of the averaging unit 259. The averaging unit is represented functionally as a block and its internal structure may include the FIFO buffer 250 and sum unit 220 of FIG. 2 or have a different structure. The averaging unit 259 yields a value TIMEAVGCOUNT 360 that count the accumulated length of time during which the proximity signal PROXSTAT was active, in a time window of predetermined length. If the averaging unit is implemented as disclosed in FIG. 2, the window length will correspond to the depth of the FIFO times the update rate, which is determined by the rate of production of new PROXSTAT samples, scaled by the integration time of the counter 280, if present.

The value TIMEAVGCOUNT is compared with a suitable threshold TIMEAVGTHRESH 320 in comparator 260, as in the previous embodiment. A time-averaged proximity flag PROXTIMESTAT 350 is generated if the threshold TIMEAVGTHRESH is exceeded and the PROXSTAT is active, as represented by the logic gate 273, which substitutes, in this embodiment, the multiplexer 270 of FIG. 2.

Importantly, the signal PROXTIMESTAT 350 is fed back to the input of the averaging unit through the logic AND gate 271 that has its inputs tied to the PROXSTAT value and to the complement of PROXTIMESTAT. In this embodiment, the logic gate 271 inhibits the accumulation of new PROXSTAT values if the time-averaged proximity signal PROXTIMESTAT is already active. This is advantageous when the sensor is used to limit the radio power of a mobile device, since it allows the power to return to a high level in short intervals during the whole detection period, rather than allowing a short time of high power only at the beginning, as in the previous embodiment. The inventors have found that this manner of detecting proximity improves significatively the connectivity when the detection period (the window length mentioned above) is rather long, i.e., spans over several minutes.

If, to make an example, the embodiment of FIG. 2 would yield a 2 min high power period at the beginning, and then low power for the rest of detection time, until the device is moved away, this improved embodiment, thanks to the negative feedback disclosed above, would give with similar parameters, a series of 2 min-periods of high power alternated with periods of low power. In this manner, connectivity can be preserved without worsening excessively the SAR.

Manufacturers also have the flexibility to use a shorter FIFO duration while still complying with the SAR limit computed on a longer regulatory window.

FIG. 7 shows the values of the immediate proximity status PROXSTAT (plot 310), the corresponding values of "1" values present in the FIFO buffer TIMEAVGCOUNT (plot 360), the threshold TIMEAVGTHRESH (plot 320) and the time-averaged proximity status TIMEAVGSTAT (plot 350). The digital signals 310 and 350 have been shifted by an arbitrary amount to improve readability.

FIG. 7 corresponds to a scenario in which the mobile device is temporarily moved close to the user in four short intervals, as shown by the immediate proximity status (plot 310). As explained above, this leads to a rise of the TIMEAVGCOUNT value, without however reaching the threshold level (line 320). Consequently, the time-averaged proximity status (plot 350) remains inactive all the time.

FIG. 8 corresponds to a situation where the proximity between the mobile device and the user is protracted, and the proximity sensor is configured as in FIG. 6. The accumulated value TIMEAVGCOUNT (plot 360) rises steadily until the threshold value 320 is exceeded, whereupon the time-averaged proximity status (plot 350) becomes active. The gate 271 now inhibits the accumulation of further "1" values in the averaging unit 259, the accumulated value 360 after a constant period at high value dips below the threshold line 320, and the time-averaged proximity status becomes temporarily inactive, despite the continuing proximity. The cycle then repeats until the proximity ends.

FIG. 9 shows another variant in which the PROXSTAT signal is gated by logic gate 271 and by a second OR gate 272 with an input receiving the complementary value of PROXSTAT. This variant works as that of FIG. 6 when PROXSTAT is active. When PROXSTAT is inactive, however, the averaging unit 259 is pre-filled with "1" values, which may provide a faster response. The logic gates at 271 and 272 simulate an active PROXSTAT value even though PROXSTAT is inactive and fill the memory of the averaging unit accordingly. When the mobile device is brough in proximity with a body part of the user, the PROXTIMESTAT flag will immediately turn to active.

TABLE variables

| symbol | meaning |
|---|---|
| A(n) | baseline estimation |
| D(n) | baseline-subtracted data |
| R(n) | raw capacitance data |
| U(n) | useful (filtered) data |
| PROXSTAT | immediate proximity status |
| PROXTIMECONFIG | selects operation generating PROXTIMESTAT (logic AND or logic OR) |
| PROXTIMESTAT | combined proximity status threshold for the immediate proximity status |
| TIMEAVGCOND | selects whether the power is determined by PROXSTAT/PROXTIMESTAT |
| TIMEAVGCOUNT | how many '1' are currently present in the FIFO buffer |
| TIMEAVGDURATION | length of the FIFO buffer |
| TimeAvgFifo | The FIFO buffer: up to 256 past values |
| TIMEAVGGRAN | time granularity of the insertion in the FIFO buffer |
| TIMEAVGINIT | defines how the FIFO buffer is initialized |
| TIMEAVGSTAT | time-averaged proximity status |
| TIMEAVGTHRESH | threshold for TIMEAVGSTAT to be set |
| TimeGranCount | counts how many times PROXSTAT was set during the current TIMEAVGGRAN interval |

Several improvements and perfectioning to the present invention are possible. On one hand, the implementation of FIG. 2 uses a counter 280 to reduce the depth of the memory buffer 250. This is advantageous because the regulations require long averaging times (of the order of several minutes) and, if updated at full rate, the buffer 250 would need to be inordinately long. A counter is a means to implement a granularity interval longer than the time occurring between two successive values of the proximity flag PROXSTAT but it is not the only possibility.

The unit 280 could be any device that converts a stream of PROXSTAT values into an output stream with a lower rate, with a rate reduction ratio TIMEAVGGRAN. Each value of the output stream could be a summary of several PROXSTAT values, for example a count of the '1' values quantized, as disclosed above, or a maximum. In the important case of a one-bit implementation, the rate compression unit 280 could be configured to yield '0' if all the previous TIMEAVGGRAN input values are '0', and '1' in all other cases, which is equivalent to a maximum.

Ideally, the TIMEAVGCOUNT variable 360 should be a measure of the true average of the distance, or at least of the proximity signal PROXSTAT in a sliding time window that has the same size as the window prescribed in the regulatory SAR measurements. In the USA, regulation call for a window of a few seconds to 100 seconds, depending on the frequency of. In the rest of the world the window is 6 minutes. In the device of the invention, the length of the integration window is determined by the depth of the FIFO buffer 250 (D or TIMEAVGDURATION) and the granularity M introduced by counter 280, i.e. the number of PROXSTAT samples considered to create one entry in the FIFO. The invention is not bound to special values of D and M but, in a typical implementation, D may be selectable between 2 and 256 positions, while the granularity M nay be a number between 1 and 16. The scan period $T_{scan}$ can usefully between a few tens of milliseconds to a few hundred of milliseconds. A typical value of the scan period is 100 ms.

The total duration of the integration window is $M \cdot D \cdot T_{scan}$. If the size of the FIFO buffer D is large—that is, the resolution of the FIFO is fine—the granularity M can be proportionally coarser. A wider range could be achieved by defining $M=2^k$ with k=0:7 for instance with no reduction is the relative resolution of the product (1/256).

Ideally, the time averaged trigger should:
1) calculate the moving sum S[n] of the PROXSTAT flag (having values 0 or 1) over D samples
2) compare the moving sum to a threshold TH and set PROXTIMESTAT for the next sample $$S[n] = \sum_{i=0}^{D-1} PROXSTAT[n-i]$$

$$PROXTIMESTAT[n+1] = 1 \text{ when } S[n] \geq TH$$

A refinement is possible: when the PROXTIMESTAT flag is set, power is expected to be reduced, consequently, the user is no longer exposed to a high power even if the device is in close proximity (PROXSTAT[n]=1); hence, a feedback can be introduced as shown below:

$$P[n] = PROXSTAT[n] \cdot (1 - PROXTIMESTAT[n])$$

$$S[n] = \sum_{i=0}^{D-1} P[n-1]$$

$$PROXTIMESTAT[n+1] = 1 \text{ when } S[n] \geq TH$$

A FIFO buffer 250 is a suitable way to calculate a sliding sum. In an hardware implementation, a FIFO of D places may be implemented as a shift register SR[0:N−1] whose content is shifted at each insertion of a new sample P[n] in SR[0]. In software, there are more possibilities, for example a structure like the hardware realization or a buffer with an index in which the data are not moved but the oldest data are overwritten by the newest sample. The index is incremented and wraps around when it reaches D.

For reasons of cost, area and complexity, it is desirable to limit the depth D of the FIFO to a reasonable size (say, 256 samples). As one new sample P[n] is produced every scan period $T_{scan}$, the duration covered by the time averaging calculation above is $T_{avg}=T_{scan} \times D$. Typical numbers are $T_{scan}=100$ ms, D=256, which leads to $T_{avg}=25.6$ s. The regulations, however, allow averaging over up to 6 minutes (360 s). To take full advantage of this duration the depth of the FIFO could be extended, but the cost would not be acceptable. Besides, the scan period could be much shorter than 100 ms in some cases, which would further increase the needed size of the FIFO. Should be $T_{scan}=2$ ms, for example, a FIFO capable of holding 6 minutes of PROXSTAT data would need to have D=360 s/2 ms=180,000 positions.

The multiplication of positions in the FIFO can be mitigated by processing each entry P[n] of the FIFO such that each P[n] holds an 'aggregation' of N PROXSTAT values, each of them produced in a scan period $T_{scan}$. A new P[n] is produced every $M \cdot T_{scan}$ $$P[n] = f(\text{PROXSTAT}[n,j]_{j=1}^{M}i) \cdot (1 - \text{PROXTIMESTAT}[n])$$

where $f(\text{PROXSTAT}[n,j]_{j=1}^{M})$ is a suitable aggregation function of M samples. In the examples disclosed so far, the aggregation results from the work of the data compression unit 280. The duration of the monitoring of PROXSTAT is now $T_{avg} = M \cdot D \cdot T_{scan}$. The challenge lies in the definition of the aggregation function $f$. Ideally, $f$ would be the average of all the M PROXSTAT flags, but this would require $\log_2(M)$ bits for each entry in the FIFO, which is still undesirable. In the examples show previously the function $f$ takes the maximum of the M PROXSTAT flags. since the flags are binary-valued, a single high value of the PROXSTAT flag is all it takes to insert a '1' value in the FIFO. This is the most conservative approach which maximizes the radiation exposure margin at the expense of the connectivity: by picking the maximum value, the sum 360 (see FIG. 2) of the FIFO content is always higher than the true average of the PROXSTAT in the integration window of interest. The most liberal approach, on the other hand, would be to take the minimum of the M PROXSTAT flags, i.e. a '0' value would be returned if any of the M flags was low. In this approach the sum of the FIFO buffer would always be below the true average. The resulting process would enhance connectivity but it would hardly guarantee the regulatory radiation exposure level.

In a favourable embodiment, the rate compression unit 280 is configured to yield an encoded value $f(\text{PROXSTAT}[n,j]_{j=1}^{M})$ such that the sum of the values stored in the FIFO buffer represents the true average of the PROXSTAT in the integration window of interest. This can be obtained in several ways, one possibility being when the compression unit 280 has the structure of FIGS. 10 and 11, that is that of a sigma-delta modulator.

FIG. 10 is a generic representation of a first-order sigma-delta modulator with an analogue input. It receives an IN value, and the difference unit 1004 subtracts from the input value the analog value fed back from the output via the digital-to-analog converter 1024. The result is processed by integrator 1005 that generates an accumulated value, followed by a comparator 1009 that acts as a quantizer and generates a digital output. The modulator operates in discrete time, thanks to the latch 1008 that is clocked by the clock signal generated by 1026.

Sigma-delta modulators are normally followed by a decimation filter. In this example, the decimation filter is made by the FIFO buffer and sun unit disclosed above. They are known with an analogue input, and are indeed used to provide a digital representation of the same, but they can also function when the input is a digital value.

FIG. 11 shows a rate reducing unit with a sigma-delta modulator in lieu of the counter 280 of FIG. 2; we will show that this structure leads to a true time averaging. As in previous examples, the variable PROXSTAT 310 at the input is combined in an 'and' gate 1010 with the complement of the PROXTIMESTAT variable, or of the TIMEAVGSTAT variable, coming from 'not' gate 1015. Thus, the PROXSTAT information is considered in the modulator only when full-power transmission is allowed. Whenever PROXTIMESTAT is equal to '1' the modulator is fed '0' values and the user exposure is low (same effect for low power or high distance). The elements 1010, 1004, 1005 represented with a thick border operate at full rate, being updated at each scan period $T_{scan}$, for example, at each occurrence of a new PROXSTAT value, while the element 1009, 1008, 1015, represented with a dotted border, operate at a rate reduced by a factor M, or every M scan periods. The values PROXSTAT, PROXTIMESTAT may be quantized digital values, and in this case the operation of the summing node 1004 and integrator 1005 can be implemented by updating repeatedly a digital accumulator Acc[n+1]=Acc[n]−Q+PROXSTAT (disregarding the value of TIMEAVGSTAT fed back to gate 1010), where Acc denotes a digital value presented at the input of the discriminator. The following disclosure will refer to the accumulator Acc, or to the integrator 1005 equivalently.

The sigma-delta converter reduces the rate of the input stream by a given ratio. The processing done by this circuit can also be described, perhaps more intuitively, as a circuit configured to:

calculate the average rather than the worst case of each $(M \cdot T_{scan})$ window, then pass this average to the FIFO that takes the sum of all these averages.

represent the average of the $(M \cdot T_{scan})$ window and still represent this average with a single bit. Using the delta-sigma modulator, the fractional part of the average of each $(M \cdot T_{scan})$ window is carried forward to the next window.

To illustrate the preceding, supposing that the granularity interval M=16 and the sequence of the PROXSTAT values has respectively 5, 8 and 9 values high in each of three $(M \cdot T_{scan})$ periods. The first entry in the FIFO would he 0 (only 5 high flags out of a maximum value of 16) and an accumulated value of 5 is carried forward to the next window. The second window has 8 values set and the accumulated value is now 5+8=13. The second value in the FIFO is then '1' and a value '1' will be subtracted from the accumulated value for the next M=16 scan periods. During that time, there will be 9 new high PROXSTAT flat, therefore, the value accumulated at the end of the third $(M \cdot T_{scan})$ window will be 13−16+9=6, etc.

For instance, if the granularity interval is again taken as M=16 (16 values of PROXSTAT to be resumed in one value pushed into the FIFO buffer) in a first cycle 16 PROXSTAT values will be summed into the numeric accumulator 1005, unit 1002 is a M-factor rate compressor that, at the end of a granularity cycle, will let forward the accumulated sum to the comparator 1009 which will generate an output value of '1' if the accumulated sum exceed a stated threshold, which could be 8=M/2. In contrast with the accumulator of the previous example, the accumulator 1005 is not reset to zero at the end of a granularity interval but the output value of the sigma-delta converter is subtracted from the input, multiplied by a factor M introduced by the M rate expander 1006. Simulations have shown that the averaged proximity values generated by in this way are more reliable than that of the previous example.

FIG. 12 shows the delta-sigma modulator augmented with the FIFO buffer 250 and adder 220, like in FIG. 2. The dashed box 520 encloses the elements that operate at a reduced rate, once every $(M \cdot T_{scan})$ periods, while the elements 1010, 1005, 1004, represented with a thick border, operate at full rate.

Since the threshold value applied to the comparator 1009 is M/2, the lowest value accumulated occurs when the comparator outputs a '1' and the M following PROXSTAT values are '0'. The accumulator is decremented M times and its value after receiving these M PROXSTAT=0 is $Acc_{min}=M/2-M=-M/2$. Similarly, if the accumulated value is just below M/2, Q=0 at the latch 1008 and the highest accumulated value occurs if the M following PROXSTAT values are '1': $Acc_{max}=M/2+M=3M/2$.

To simplify, the threshold value applied to the trigger 1009 could be set to any value, and it could be zero. The choice of M/2 causes the output to match the true average from the first cycle. Setting it to 0 would change the behaviour only after reset. The range of the accumulator would be [−M, M].

When the FIFO buffer 250 is full the total number of PROXSTAT values applied to the input of the modulator is approximated by the sum 365 (S) of the '1' values in the FIFO, such that $\hat{N}=S\times M$ where N denotes the exact number of '1' values at the input of the modulator and $\hat{N}$ is its approximation based on the FIFO content. The difference between N and $\hat{N}$ can be bounded. At the end of each $(M \cdot T_{scan})$ period, a new value of the accumulator (Acc) is calculated. Assuming that the initial state of the modulator at period 0 is Acc=Acc[0] and Q=Q[0], the value of the accumulator at the end of period 1 is $$Acc[1] = \sum_{i=1}^{M} PROXSTAT[i] - M \cdot Q[0] + Acc[0]$$

which can be extended to the end of the $D^{th}$ $(M \cdot T_{scan})$ period $$Acc[D] = \sum_{i=1}^{M} PROXSTAT[i+(D-1)M] - M \cdot Q[D-1] + Acc[D-1]$$

Summing terms for Acc[1:D] we get:

$$\sum_{i=1}^{D} Acc[i] = \sum_{i=1}^{M+D} PROXSTAT[i] - \sum_{i=1}^{D} M \cdot Q[D-1] + \sum_{i=1}^{D} Acc[i-1]$$

simplifying, reordering, and remembering that $\Sigma_i PROXSTAT[i]=N$ $$N = M \cdot \sum_{i=1}^{n} Q[i-1] + Acc[D] - Acc[0]$$

generalizing to any scan period of index n $$N[n] = M \cdot \sum_{i=n+1-D}^{D} Q[i-1] + Acc[n] - Acc[n-D]$$

$\Sigma_{i=n+1-D}^{n} Q[i-1]$ is the sum of the FIFO (S) before the shift in Q[n]; hence, $N[n]=M \cdot S[n-1]+Acc[n]-Acc[n-D]$ $N[n]=\hat{N}[N-1]+Acc[n]-Acc[n-D]$ In all cases, to meet the regulatory SAR limitations the highest possible value of N must be considered based only on its approximation $\hat{N}$. The smallest and largest possible values of Acc[n−D] are −M/2 and 3M/2; hence, a blind scheme would require that the FIFO sum S be augmented by 3M/2−(−M/2))/M=2 before comparison to guarantee that $\hat{N}+2 \geq N$ and that the regulation be always satisfied. Alternatively, the threshold TH could be lowered by 2.

The scheme can be improved since Acc[n] is known and is held in the current accumulator. Comparing that value to M/2 allows to decide whether to add only 1 (when Acc[n] <M/2), 2 otherwise. This condition is already known at the end of period [n] and is contained in Q[n]. The upper bound on S $(S_{UB})$ is:

$S_{UB}[n]=S[n-1]+Q[n]+1$

Finally, the threshold for the accumulator quantization can be set to any arbitrary value. The easiest for implementation is zero. The reason for choosing M/2 initially is that this matches the behaviour of the exact/match case and corresponds to the definition of average considering that the output signal is 0/1, i.e., has a bias of 0.5. Changing from M/2 to 0 will make the first TIMEAVGSTAT decision (when the FIFO is filled for the first time) pessimistic by ½, and this term will disappear in subsequent decisions.

FIG. 13 shows an improved version of the processor in which the accumulator threshold in the modulator is set to zero and the FIFO sum is bound below a maximum. As before, the dashed box 520 indicates the elements that are clocked at the reduced rate.

The method can be represented by the flowchart of FIG. 14. Step 402 is an initialization procedure that is carried out only at the beginning of the processing, and may include, among others, initializing the FIFO, resetting the output Q=0 of the latch 1008, resetting of the accumulator (the output of the integrator 1005 after the rate downconversion 1002, and setting to zero various counters. Successive steps will refer to a counter m that is incremented repeatedly from 0 to M and is used to determine the position inside a $(M \cdot T_{scan})$ period. This counter may also be reset to zero in initialization 302.

In step 405, the method wait until a new PROXSTAT value is available. In principle, the method is executed and looped back to step 305 in each $T_{scan}$ interval.

Step 420 represents the update of the accumulator value Acc or, equivalently, the actions of integrator 1005 and adding node 1004

$Acc[n+1]=Acc[n]-Q+PROXSTAT \wedge TIMEAVGSTAT$ where $\wedge$ denotes the AND operation. in Step 422 the counter m mentioned previously is incremented.

Test 455 is used to determine the end of a $(M \cdot T_{scan})$ period. The accumulator is updated M times until the control is passed to test 440 that stands for the action of the comparator 1009 and latch 1008. After that, the sum of the FIFO is computed (step 460), a new value of Q is pushed in the FIFO (step 470), comparator 260 compares the summed value with the threshold (step 475) and the TIMEAVGSTAT value is set accordingly (steps 480, 481), the counter m is reset to zero, the value of PROXTIMESTAT is updated (step 490) and the cycle restarts.

FIG. 15 shows the action of the proximity sensor of the invention in a smartphone. The device is tested by approaching a "phantom", simulating a body part, to the smartphone, and measuring the electromagnetic radiation absorbed in the phantom. During the test, the distance d between the phantom and the phone decreases initially from 50 mm to 0 mm (zone A of the plot), the phantom is then kept in contact with the phone for a certain time (zone B) and is finally moved away until the distance is again 50 mm (zone C). The dashed line 'PS off' represents the dose when the phone has no mitigation mechanism: the radio power is not adapted at all. The dotted line 'TA off' is the response obtained when the RF power is controlled by an immediate proximity flag like PROXSTAT. The power decreases abruptly when the distance between the approaching phantom and the phone reaches a certain threshold value, and is restored to the initial value when, the phantom is at the same distance in its retreat motion.

The solid line TA-PS is the result of the time-averaged proximity flag of the invention. A little while after the approaching phantom crosses the threshold, the RF power is decreased, but it is momentarily raised to the full value in a cyclical fashion, even while the phantom is in contact. In this way the time-integrated dose is reduced, but the connectivity is not as degraded as in the previous case.

In another embodiment, not represented in the drawing, the proximity detector of the invention may dispense with the averaging FIFO and to generate a cyclic proximity signal that causes the RF power to be reduced cyclically when the portable device is near the user. In this manner, the RF power alternates between a high value and a Low value following a simple periodic rule with a determined duty cycle. In this manner, the SAR is reduced with less impact on the connectivity. When the immediate proximity flag indicates that the wireless device is near the user, the radio power is periodically set to a lower value, and then back to the higher normal value. Simplicity is a distinct advantage of this variant that is very suitable to low-cost devices.

In the above examples, the variable that is applied to the input 310 is an immediate proximity status PROXSTAT that is raised as soon as the proximity sensor senses that a given capacitive electrode is near to a given RF antenna, but the proximity sensor may in fact be capable to determine proximity with respect to several antennas and capacitive input electrodes of the portable device. In an advantageous variant, the proximity sensor is configured to build a logic combination of proximity signals coming from several antennas and/or input electrodes and present this combined signal at the input 310 for time-averaging. For example, the signal may be a sum or a logical OR or any suitable logic function of the proximity signals from multiple antennas/electrodes.

The proximity sensor may be configured to discriminate high-permittivity bodies and low-permittivity bodies, the former ones being indicative that a part of a user's body is near. Other proximity sensors have means to discriminate a legitimate proximity from contamination, for example dew or water on the portable device. In proximity sensor with or without these capabilities, the signal given to the input of the time-averaging unit 310 may be a qualified proximity signal BODYSTAT that is raised for body-like proximity and not otherwise. Several devices are possible to build a qualified proximity signal that is raised when a body part of a user is near but is considerably less sensitive or essentially insensitive to inanimate bodies or contaminations, and all are included in the present invention. Such qualified proximity signals take most often binary values but they can be multi-level as well.

As mentioned above, an important realization of the invention operates on a one-bit binary signal, but this is not the only case, and in fact the invention can be adapted to operate on non-binary signal, insofar as they can be represented by digital word of a suitable number of bits. For example, the proximity sensor may be configured to generate a multi-level immediate proximity signal where different values correspond to multiple distances. In this case, the distance level can be encoded in binary form, for example in a two-bits word capable of representing four distance levels from 0 (no proximity) to 3 (nearest), which is presented at the input 310. Naturally, the rate compressor 280, FIFO buffer 250 and sum function 220 will have the suitable bit width.

In another variant of the invention, the value presented at the input 310 for time-averaging may be, rather than the binary-valued PROXSTAT, the digital value D(n) representing the self-capacitance of the antennas/electrodes as determined by the ADC and after filtering and subtraction of the baseline.

The present invention implements a windowed average using a memory buffer that has as many taps as required by the duration of the averaging interval (with M or TIME-AVGRAN) as scaling factor. While precise, this requires a sizable memory. The averaging unit may include, rather than a sliding-window averager with a FIFO buffer, a general digital low-pass filter that can be implemented more compactly, for example a recursive low-pass digital filter (an IIR filter).

The present disclosure also includes the appendixes "time averaging 2.0" and "Time averaged proximity sensor" appended hereto.

REFERENCE SYMBOLS IN THE FIGURES

Ld decoupling inductance
Cx tactile capacitance
Cd decoupling capacitance
20 electrode
23 analogue processor
25 A/D converter
30 filter
40 difference
50 discriminator
60 baseline estimator
70 threshold
90 RF receiver/transmitter
105 generation of a new PROXSTAT value
120 counting
122 end of granularity interval
130 push into shift register
135 update TIMEAVGCOUNT
140 comparison with TIMEAVGTHRESH
150 set time-averaged proximity flag
160 reset time-averaged proximity flag
170 logic operation
220 sum
230 baseline estimation
240 drift-corrected samples
250 FIFO buffer
260 comparator
270 logic operation
271 logic gate
272 logic gate
273 logic gate
280 counter or rate compression unit
310 PROXSTAT variable
320 TIMEAVGTHRESH variable
330 TIMEAVGSTAT variable
340 PROXTIMECONFIG variable
350 PROXTIMESTAT variable
360 TimeAvgCount variable
365 True average
370 serial input of the FIFO buffer
402 initialization
405 generation of a new PROXSTAT value
420 update accumulator/integrate
422 increment counter 435 test counter
440 test accumulator
451 set Q
450 reset Q
460 sum FIFO
470 push new value of Q into FIFO
475 test sum
480 reset TIMEAVGSTAT
481 set TIMEAVGSTAT
490 set PROXTIMESTAT, logic operation
520 downscaled rate
1002 rate downconversion
1004 difference
1005 integration
1006 rate upconversion
1007 delay
1008 latch
1009 trigger
1010 and gate
1015 not gate, inverter
1024 digital/analog converter
1026 clock

The invention claimed is:

1. A proximity sensor for a portable wireless connected device, the sensor being arranged to determine whether a part of a user's body is near the portable connected wireless device, the sensor comprising at least one capacitive input electrode, a circuit configured to determine a capacitance of the at least one capacitive input electrode and generate, based on the capacitance, an immediate proximity status flag that becomes active when a part of a user's body is close to the proximity sensor, characterized by an averaging unit configured to generate a running average of the immediate proximity status flag in a predetermined time window, and by a decision unit generating a time-averaged proximity status flag based on an averaged or accumulated value of the immediate proximity status flag in the time window.

2. The proximity sensor of claim 1, the decision unit being configured to switch the time-averaged proximity status flag to an active state when the running average exceeds a predetermined threshold.

3. The proximity sensor of claim 1, the decision unit being configured to switch temporarily and repeatedly the time-averaged proximity status flag to an inactive state when the immediate proximity status flag is active.

4. The proximity sensor of claim 1, the averaging unit including a sigma/delta modulator and a FIFO buffer, wherein the sigma/delta modulator is configured as a rate compression unit and the FIFO buffer is periodically supplied with values provided by the sigma/delta modulator.

5. The proximity sensor of claim 1 wherein the immediate proximity status flag is any one of: a binary proximity flag indicating that the detector is near a conducting body, a qualified binary proximity flag indicating that the detector is near a body part of a user but with a lower sensitivity for inanimate objects and/or contaminations, a multi-level proximity flag encoding distance to the conducting body, a digital value issued from the conversion of a self-capacitance of a sense electrode and/or a self-capacitance of a radio antenna, a combined proximity flag produced by a logic function of individual proximity flags each derived from the self-capacitance of a distinct sense electrode or radio antenna.

6. The proximity sensor of claim 4, the FIFO buffer having a selectable length.

7. The proximity sensor of claim 1, including a logic circuit configured to inhibit the transmission of further values of the immediate proximity status flag to the averaging unit if the time-averaged proximity status flag is active.

8. The proximity sensor of claim 1 in combination with a portable connected wireless device that includes a radio transmitter, the proximity sensor being operatively arranged to reduce a power of the radio transmitter based on the value of the combined proximity status flag or of the immediate proximity status flag or of the time-averaged proximity status flag.

9. The proximity sensor of claim 8, the sensor being a capacitive sensor arranged to determine whether a user is in proximity to the portable connected wireless device based on a capacitance seen by a sense electrode.

10. The proximity sensor of claim 9, the sense electrode being also an antenna for emitting radio waves.

11. A method of reducing a dose of integrated SAR in a user of a wireless device comprising, in a temporal cycle:
   determine a capacitance of at least one capacitive input electrode;
   obtain an immediate proximity flag indicating whether the wireless portable device is momentarily near the user based on the capacitance;
   compute a running average value of the immediate proximity flag based on present and past values of the proximity flag and determine a time-averaged proximity flag based thereon; and
   reduce a power of a radio emission of the wireless device when the time-averaged proximity flag is asserted.

12. The method of claim 11, including resetting the power to the initial value momentarily in periods when the immediate proximity flag is asserted.

13. The method of claim 11, including reducing the rate of the immediate proximity flags before the computation of the average value to a second rate lower than a first rate of the temporal cycle by providing the immediate proximity flag to a sigma/delta modulator.

14. The method of claim 11, wherein the computing of an average value comprises pushing cyclically the value of the immediate proximity flag into a FIFO buffer and computing a sliding-window average from the sum of all the values in the FIFO buffer.

* * * * *